US010291076B2

(12) United States Patent
Georgakopoulos

(10) Patent No.: US 10,291,076 B2
(45) **Date of Patent: *May 14, 2019**

(54) MISALIGNMENT INSENSITIVE WIRELESS POWER TRANSFER WITH CYLINDRICAL, SPHERICAL AND CONICAL TRANSMITTER AND RECEIVER ELEMENTS

(71) Applicant: Stavros Georgakopoulos, Miami, FL (US)

(72) Inventor: Stavros Georgakopoulos, Miami, FL (US)

(73) Assignee: The Florida International University Board of Trustees, Miami, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/979,902

(22) Filed: May 15, 2018

(65) Prior Publication Data

US 2018/0262058 A1 Sep. 13, 2018

Related U.S. Application Data

(63) Continuation of application No. 15/084,836, filed on Mar. 30, 2016, now Pat. No. 9,997,960.

(51) Int. Cl.

| | |
|---|---|
| ***H01F 27/42*** | (2006.01) |
| ***H02J 50/12*** | (2016.01) |
| ***H05K 1/02*** | (2006.01) |
| ***H01F 27/28*** | (2006.01) |
| ***H01F 38/14*** | (2006.01) |
| ***H04B 5/00*** | (2006.01) |
| ***H05K 1/16*** | (2006.01) |
| *H05K 1/03* | (2006.01) |
| *H05K 3/10* | (2006.01) |

(52) U.S. Cl.

CPC .......... *H02J 50/12* (2016.02); *H01F 27/2804* (2013.01); *H01F 38/14* (2013.01); *H04B 5/0037* (2013.01); *H05K 1/028* (2013.01); *H05K 1/165* (2013.01); *H05K 1/0284* (2013.01); *H05K 1/0393* (2013.01); *H05K 3/103* (2013.01)

(58) Field of Classification Search

CPC ............ H02J 50/12; H02J 7/025; H02J 5/005; H03H 7/40

See application file for complete search history.

(56) References Cited

U.S. PATENT DOCUMENTS

| | | | |
|---|---|---|---|
| 2015/0295417 | A1 | 10/2015 | Park |
| 2016/0197511 | A1 | 7/2016 | Atasoy |

OTHER PUBLICATIONS

K. Finkenzeller, RFID Handbook: Fundamentals and Applications in Contactless Smart Cards and Identification, 2nd ed. New York: Wiley 2003, pp. 65-112.

(Continued)

*Primary Examiner* — Sibin Chen

(74) *Attorney, Agent, or Firm* — Saliwanchik, Lloyd & Eisenschenk

(57) ABSTRACT

Wireless power transfer systems including wireless transmitter and receivers, which are insensitive to misalignment, are provided. A wireless power transfer system can include a first conductive loop that has cylindrical, conical, or spherical symmetry. The wireless power transfer system can further include a second conductive loop that is formed around the first conductive loop, and can also share the same type of symmetry as the first conductive loop. The wireless transfer system can be a wearable device or an implantable device.

20 Claims, 21 Drawing Sheets

Resonator

Load or Source

RX or TX

Resonator

Source or Load

TX or RX

(56) References Cited

OTHER PUBLICATIONS

A. Kurs, A. Karalis, R. Moffatt and M. Sohacic Marin, "Simultaneous midrange power transfer to multiple devices", Applied Physics Letter, vol. 96, 044102, 2010.
H. Hu, K. Bao, J. Gibson and S. V. Georgakopoulos, "Printable and Conformal Strongly Coupled Magnetic Resonant Systems for Wireless Powering," 2014 IEEE 15th Annual IEEE Wireless and Microwave Technology Conference (WAMICON), Tampa Bay, FL, Jun. 6, 2014.

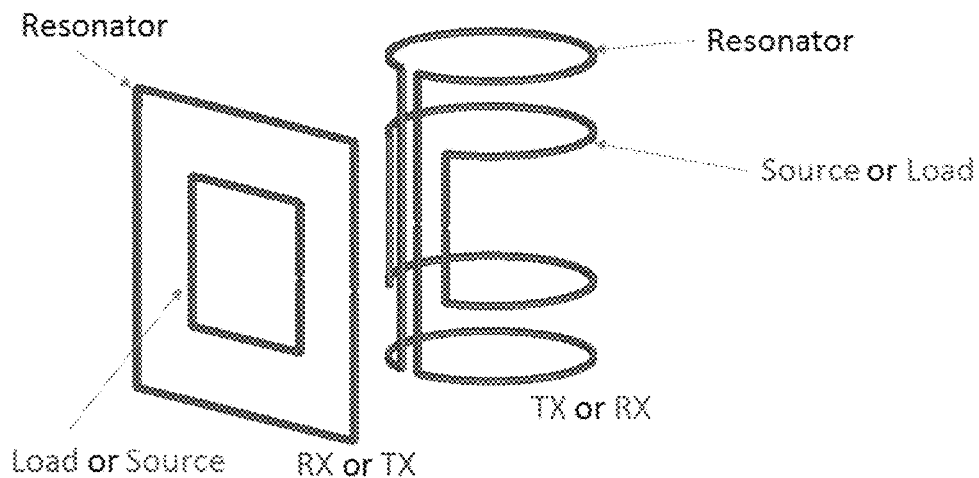
Figure 4A
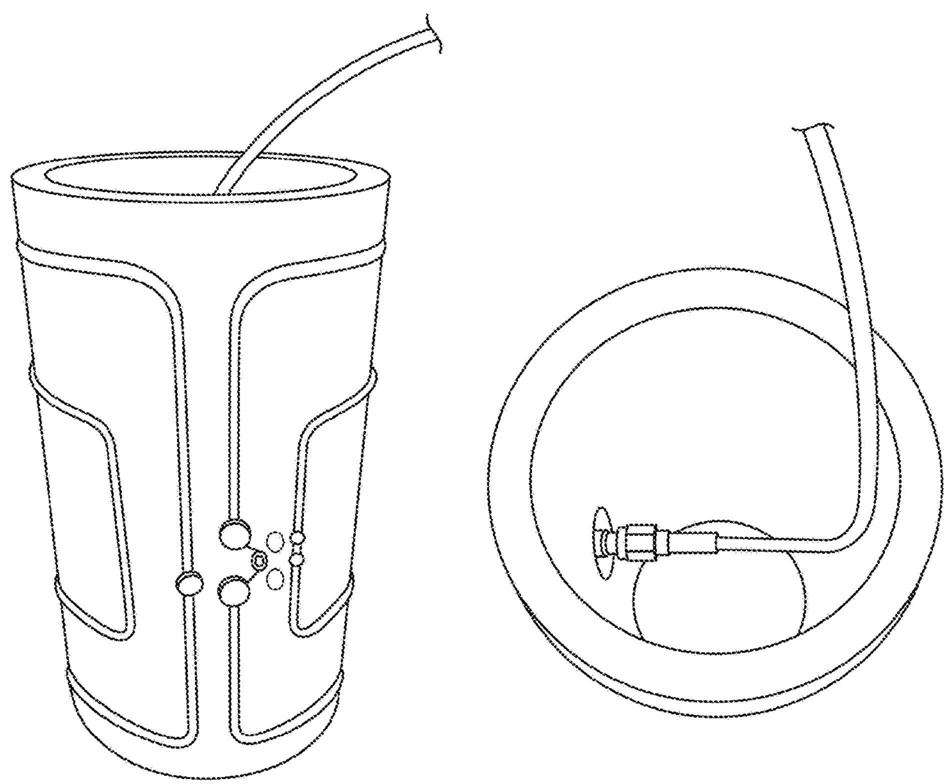
Figure 4B
Figure 4C

Figure 23

MISALIGNMENT INSENSITIVE WIRELESS POWER TRANSFER WITH CYLINDRICAL, SPHERICAL AND CONICAL TRANSMITTER AND RECEIVER ELEMENTS

CROSS-REFERENCE TO RELATED APPLICATION

The present application is a continuation application of U.S. application Ser. No. 15/084,836, filed Mar. 30, 2016, the disclosure of which is hereby incorporated by reference in its entirety, including all figures, tables, and drawings.

GOVERNMENT SUPPORT

This invention was made with government support under grant number ECCS 1307984 awarded by the National Science Foundation and Army Research Office Grant W911NF-13-1-0149. The government has certain rights in the invention.

BACKGROUND

Wireless power transfer (WPT) is continuing to gain popularity as a convenient way to power devices that require electrical energy. Wireless power transfer can be used as a direct source of power, but is frequently used to charge internal batteries within a device. Examples of devices that are currently incorporating WPT technology include electric automobiles, radio-frequency identification (RFID) tags, electric toothbrushes, mobile phones, watches, other consumer electronics, and medical devices such as pacemakers.

A standard WPT system consists of four elements, typically a source loop, a load loop, and two additional loops that act as resonators. As seen in FIGS. 1 and 2, a conventional transmitter TX includes a planar resonator and source while the receiver RX includes a planar load and resonator. However, one issue with this WPT system is that it is only efficient when the transmitter and receiver elements are resonating at the same frequency and are properly aligned (i.e., they must have the same Q factor). In products incorporating WPT, it is often impractical or inconvenient to ensure proper alignment, which results in dramatic decreases in energy transfer efficiency. What is therefore needed is a WPT system that is insensitive to misalignment.

BRIEF SUMMARY

The subject invention provides novel and advantageous systems for wireless power transfer that are insensitive to misalignment. That is, the system does not show a significant decrease in efficiency even if the transmitter and receiver alignment is changed such that they are misaligned. A system can include one or more conductive loops for transmitting or receiving electric power using inductive coupling. The one or more loops can form a transmitter, a receiver, or both. The one or more loops can be formed substantially on the surface of a sphere, cone, or cylinder, or can form part of one of these shapes. If the device is a receiver, it can be a wearable device. The wearable device can be attached or worn by a subject (e.g., a human subject), such as around the head, neck, upper leg, lower leg, upper arm, forearm, torso, finger, hand, waist, foot, and/or ankle. The device can also be implantable into a subject (e.g., a human subject).

In an embodiment, a wireless power receiver can include a first conductive loop that is substantially formed on a surface of a cylinder and a second conductive loop, which is also substantially formed on the surface of the cylinder, around the first conductive loop. The first conductive loop can act as a load while the second conductive loop can act as a resonator. The wireless power receiver can be formed on a flexible substrate and be a wearable device. The arc of the first loop can span from 300 to 350 degrees of the cylinder and the arc of the load can span 60 to 90 percent of the resonator arc.

BRIEF DESCRIPTION OF DRAWINGS

FIG. 4A illustrates a second cylindrical embodiment of the present invention.

FIGS. 4B to 4F are images of a working example of the embodiment of FIG. 4A.

FIG. 23 illustrates an embodiment of the present invention wherein the wireless power transfer elements are incorporated into a wearable sleeve to be worn by patients.

DETAILED DISCLOSURE

The subject invention provides novel and advantageous systems for wireless power transfer that are insensitive to misalignment. A system can include one or more conductive loops for transmitting and receiving electric power using inductive coupling. The one or more loops can form a transmitter, a receiver, or both. The one or more loops can be formed substantially on the surface of a sphere, cone, or cylinder (i.e., have spherical, conical, or cylindrical symmetry), or can form part of one of these shapes. The sphere, cone, or cylinder is not necessarily physically present, but is used to describe the shape of the transmitter and receiver in space. In some embodiments, the system is a receiver that is a wearable device. The wearable device can be attached or worn by a subject (e.g., a human subject), such as around the head, neck, upper leg, lower leg, upper arm, forearm, torso, finger, hand, waist, foot and/or ankle. In other embodiments, the system can be an implantable receiver (e.g., into a subject, such as a human subject) (for example, for use in medical devices such as pacemakers).

The subject invention provides novel and advantageous shapes for wireless power transfer (WPT) transmitters and receivers. The WPT transmitters and receivers of the subject invention can have conical, cylindrical, or spherical symmetry. Both the transmitters and receivers can have conical, cylindrical, or spherical symmetry, or either the transmitter or receiver can be planar. The embodiments of the present invention can utilize Strongly Coupled Magnetic Resonance (SCMR), which generally has greater range and efficiency than traditional inductive coupling. The elements can be designed (scaled) to work at any frequency. Lower frequencies generally result in larger elements and the ability to transfer power over a longer range. Typical frequency ranges extend from low MHz to 100 MHz (e.g, 1-100 MHz), but elements can be designed to work at even lower and higher frequencies depending on the size and range requirements of the system.

The loops of the transmitter and/or receiver of a WPT system of the subject invention can be made of any suitable material known in the art. For example, any or all of the loops can be metal, such as copper, aluminum, gold, or silver.

In this application, "conformal" is used in two senses. "Conformal" can mean that the element is fabricated using planar conductors (e.g., flat copper stripping, not wire), but can also mean that the elements can be printed on flexible substrates and will conform to the dimensions of the user or object to which they are attached. Examples of flexible substrates that can be applied include but are not limited to FR4, Rogers Duroid, Kapton, and PET, and any printed circuit board printing technology known in the art can be applied.

Figure 1:
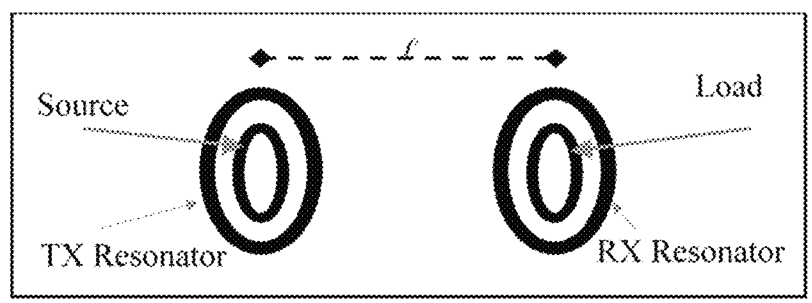
FIG. 1 is an illustration of a conventional wireless power transfer (WPT) system.
Figure 2:
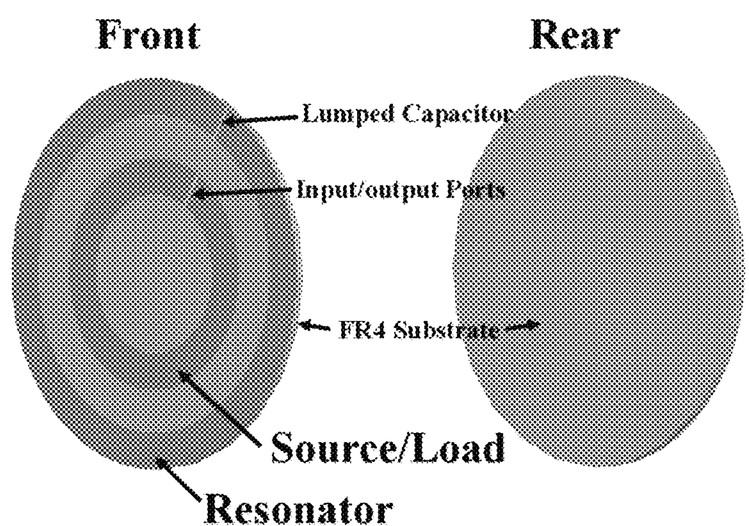
FIG. 2 is an illustration of a conformal strongly coupled magnetic resonance (SCMR) WPT system.

Referring to FIG. 1, a conventional WPT system includes four main elements: a source loop; a load loop; a transmitter TX resonator loop; and a receiver RX resonator. The source element is connected to the power source, and the load element is connected to the device that needs power, and all of the loops are formed on a single plane. FIG. 2 illustrates a conformal strongly-coupled magnetic resonance (SCMR) WPT system with an inner loop acting as a source or load, an outer loop acting as a resonator, and a lumped capacitor coupled to the outer loop, with both loops formed on a single plane.

Figure 3A:
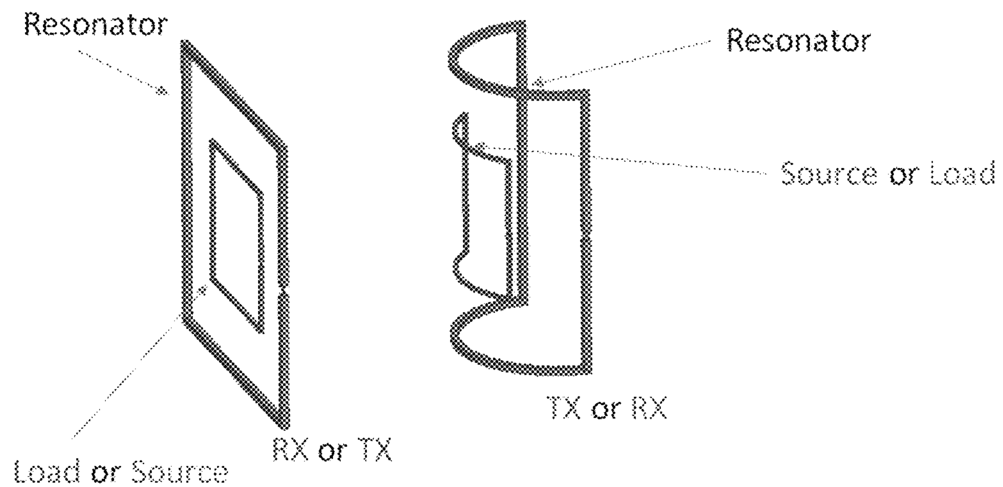
FIG. 3A illustrates a first cylindrical embodiment of the present.
Figure 3B:
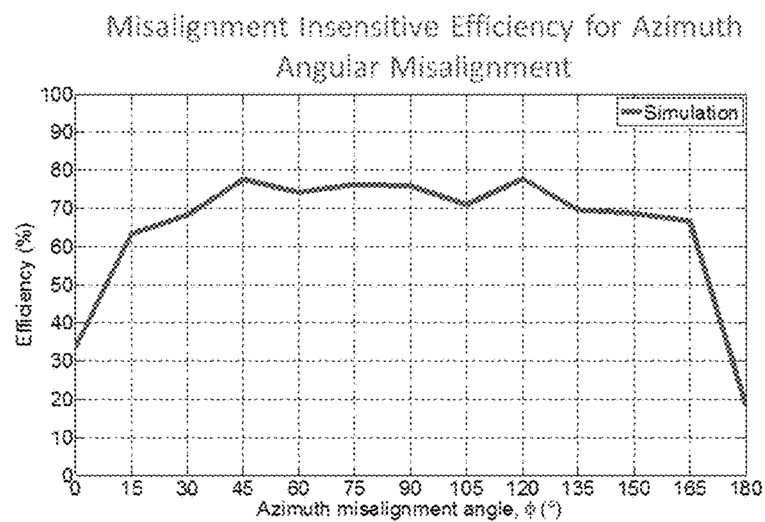
FIG. 3B is a graph of the simulated efficiency of the embodiment of FIG. 3A.

FIG. 3A illustrates an embodiment of the present invention having cylindrical symmetry. Referring to FIG. 3A, a wireless transmitter system can have an inner loop and an outer loop that form a transmitter TX, and an inner loop and outer loop that form a receiver RX. The outer loops can act as resonators for the transmitter and receiver. The inner loop and outer loop of the transmitter can have cylindrical symmetry, the inner loop and outer loop of the receiver can have cylindrical symmetry, or both transmitter and receiver loops can have cylindrical symmetry. If only one of the transmitter or receiver has cylindrical symmetry, the other can be planar, as shown. The arc of the outer loop can range from, for example, 90 to 270 degrees and, preferably, from 150 to 210 degrees. The arc of the inner loop can span from, for example, 50 to 90 percent of the arc of the outer loop and, preferably, from 70 to 85 percent of the arc of the outer loop. FIG. 3B is a graph of the simulated efficiency of the embodiment of FIG. 3A as a function of azimuth misalignment angle. Referring to FIG. 3B, relatively constant efficiency (between 60% and 80%) is displayed over a span from 15 degrees to 165 degrees (wherein at 90 degrees the RX are perfectly centered).

FIG. 4A illustrates an embodiment of the present invention that also has cylindrical symmetry. Referring to FIG. 4A, a wireless transmitter system can have an inner loop and an outer loop that form a transmitter TX, and an inner loop and outer loop that form a receiver RX. The outer loops can act as resonators for the transmitter and receiver. The inner loop and outer loop of the transmitter can have cylindrical symmetry, the inner loop and outer loop of the receiver can have cylindrical symmetry, or both transmitter and receiver loops can have cylindrical symmetry. If only one of the transmitter or receiver has cylindrical symmetry, the other can be planar, as shown. The arc of the outer loop can range from, for example, 270 to 355 degrees and, preferably, from 330 to 355 degrees. The arc of the inner loop can span from, for example, 50 to 90 percent of the arc of the outer loop and, preferably, from 70 to 85 percent of the arc of the outer loop.

Figure 4D:
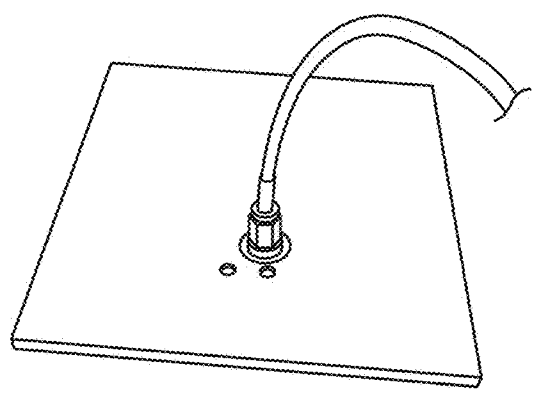
Figure 4E:
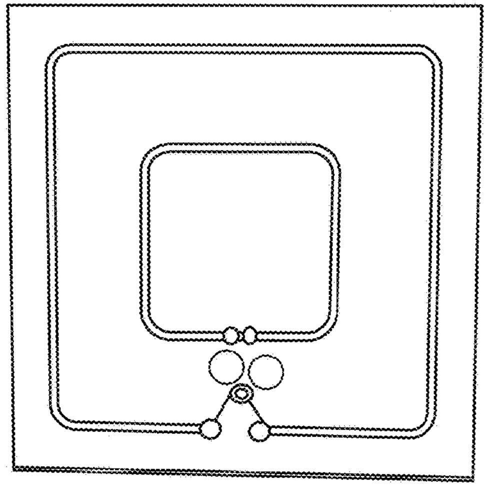
Figure 4F:
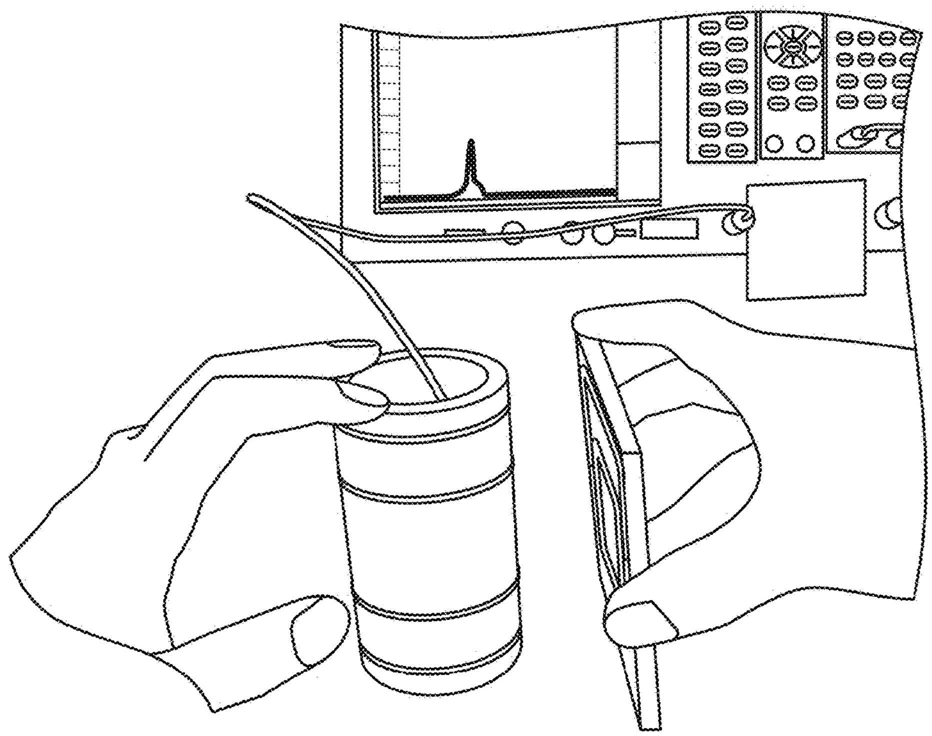

FIGS. 4B to 4F are images of a working example of the embodiment of FIG. 4A. The cylindrical element of FIGS. 4B and 4C had a radius of 30 mm, the height of the outer cylinder was 90 mm, the height of the inner cylinder was 45 mm and a 10 pf capacitor was applied. The conformal element of FIGS. 4D to 4E had an outer square with sides each being 90 mm in length, an inner square with each side being 45 mm in length and a 12 pf capacitor was applied.

Figure 4G:
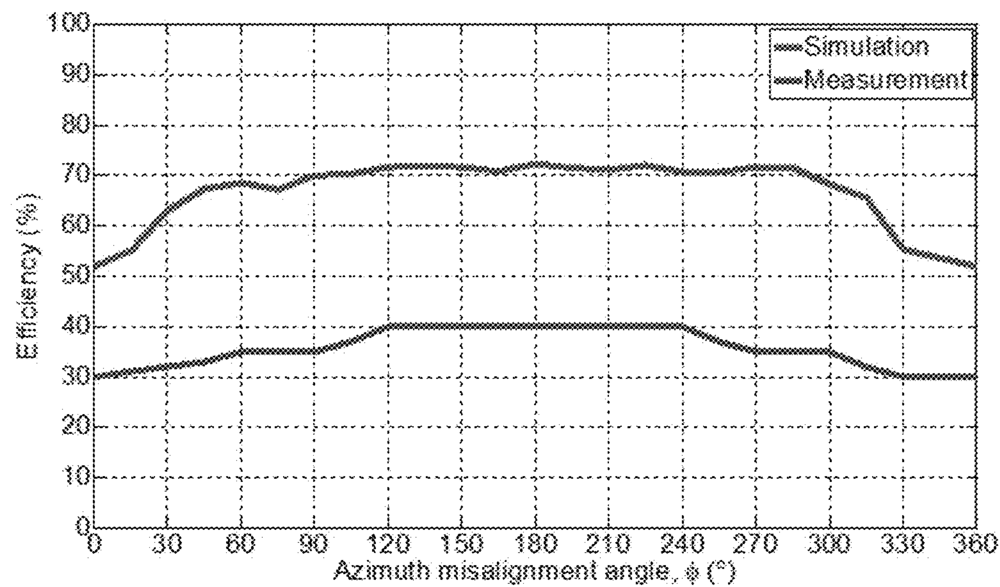
FIG. 4G is a graph of the simulated and measured efficiency of the embodiment of FIGS. 4B to 4F.

Both the cylindrical element of FIGS. 4B and 4C and the conformal element of FIGS. 4D were fabricated using 1.7 mm thick copper wire. FIG. 4G is a graph of the simulated efficiency of the embodiment of FIG. 4A and the measured efficiency of the working example of this embodiment, shown in FIGS. 4B to 4F, as a function of azimuth misalignment angle. The red line (displayed higher on the graph) is for the simulated efficiency, and the blue line (displayed lower on the graph) is for the measured efficiency. Referring to FIG. 4G, relatively constant efficiency is shown across a broad range of angles.

Figure 5A:
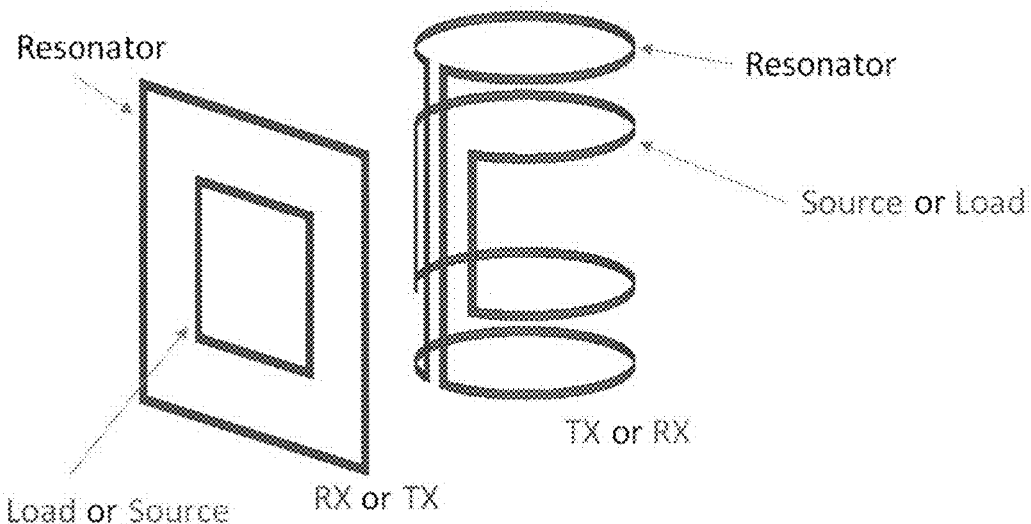
FIG. 5A illustrates a conformal cylindrical embodiment of the present invention.
Figure 5B:
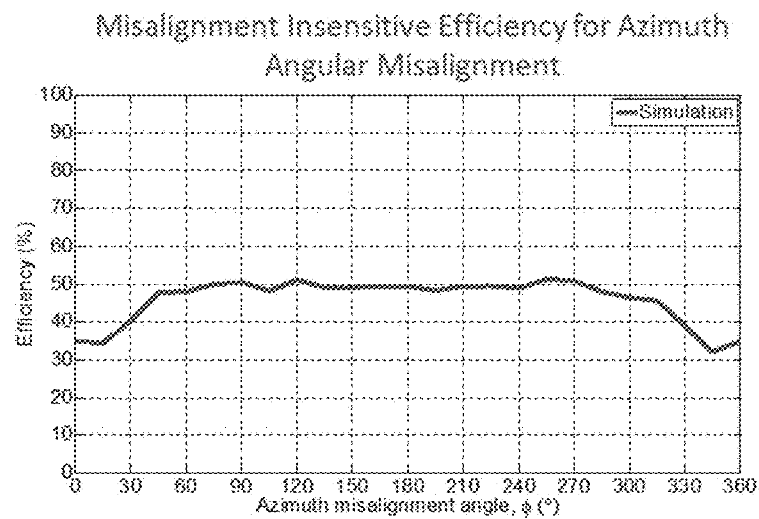
FIG. 5B is a graph of the simulated efficiency of the embodiment of FIG. 5A.

FIG. 5A illustrates a conformal (i.e., flexible and able to form-fit a user or other object) embodiment of the present invention that also has cylindrical symmetry. Referring to FIG. 5A, a wireless transmitter system can have an inner loop and an outer loop that form a transmitter TX, and an inner loop and outer loop that form a receiver RX. The outer loops can act as resonators for the transmitter and receiver. The inner loop and outer loop of the transmitter can have cylindrical symmetry, the inner loop and outer loop of the receiver can have cylindrical symmetry, or both transmitter and receiver loops can have cylindrical symmetry. The arc of the outer loop can range from, for example, 90 degrees to 360 degrees, or 180 to 360 degrees. The arc of the inner loop can span from 50 to 90 percent of the arc of the outer loop and, preferably, from 80 to 90 percent of the arc of the outer loop and, even more preferably, from 85 to 88 percent of the arc of the outer loop. The height of the inner loop can span from, for example, 25 to 80 percent of the outer loop and, preferably, from 45 to 65 percent of the outer loop. If only one of the transmitter or receiver has cylindrical symmetry, the other can be planar, as shown. If the transmitter or receiver is planar, its shape can be, for example, circular, square (as shown), or rectangular. FIG. 5B is a graph of the simulated efficiency of the embodiment of FIG. 5A as a function of azimuth misalignment angle. In order to construct the simulated efficiency graph of FIG. 5A, the dimensions were chosen as follows. The arc of the cylindrical resonator was 345°, the arc of the cylindrical source/load was 307°, the radius of both cylinders was 30 mm, the height of the cylindrical resonator was 90 mm, and the height of the inner cylinder was 45 mm. For the conformal element, the length of each side of the outer square was 90 mm and the length of each side of the inner square was 45 mm. Both the cylindrical element and the conformal element were assumed to be made of 3 mm wide, 0.035 mm thick copper strip.

If either the transmitter (TX) or receiver (RX) is planar and rectangular (or square), the sides of the inner loop and outer loop of the rectangles can have lengths that range from, for example, 50 to 150 percent (and preferably from 85 to 115 percent) of the height of the inner loop and outer loop of the corresponding cylindrical TX or RX, respectively. Similarly, if either the TX or RX is planar and circular, the diameters of the inner loop and outer loop of the circular TX/RX can have diameters that range from, for example, 50 to 150 percent (and preferably from 85 to 115 percent) of the height of the inner loop and outer loop of the corresponding cylindrical TX or RX, respectively.

Figure 6A:
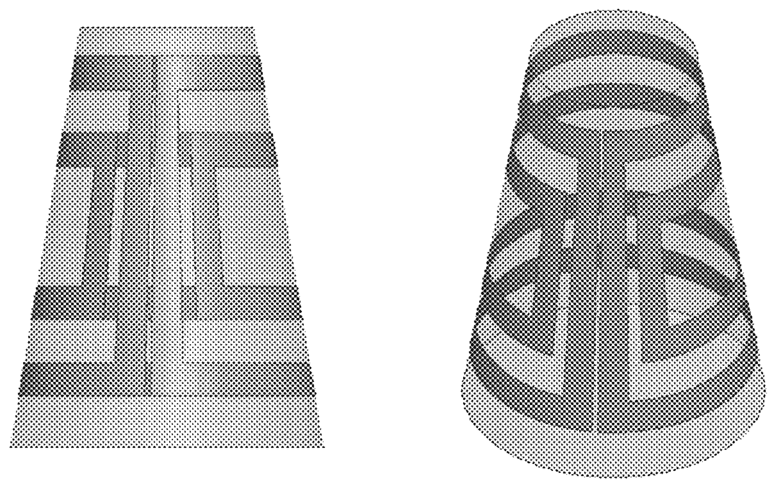
FIG. 6A is conformal conical embodiment of the present invention spanning approximately 345 degrees.
Figure 6B:
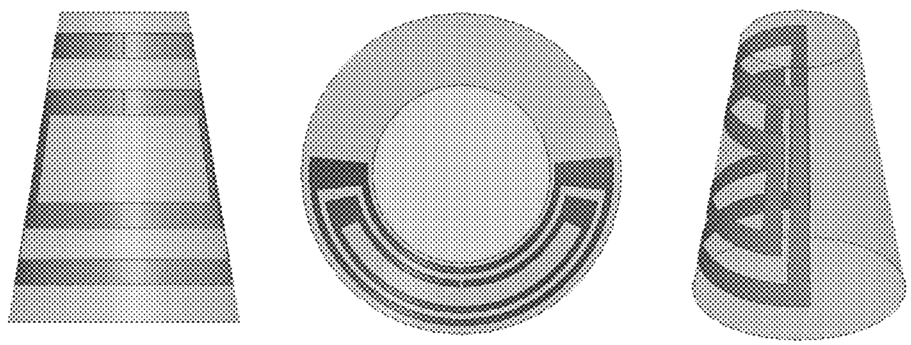
FIG. 6B is conformal conical embodiment of the present invention spanning approximately 180 degrees.
Figure 7A:
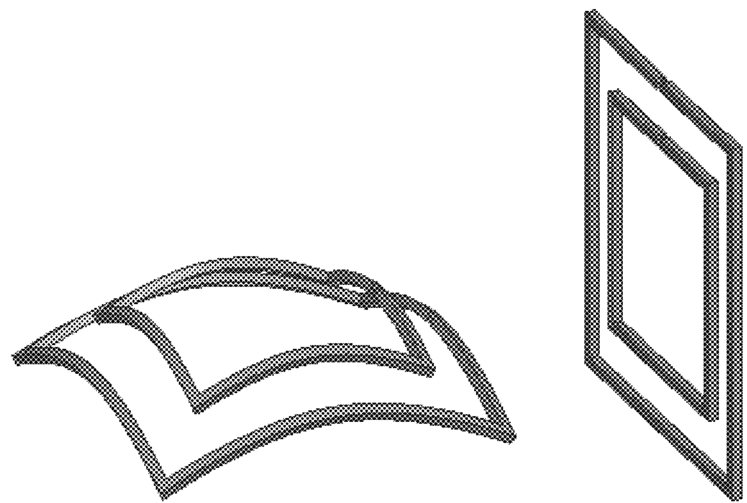
FIG. 7A illustrates two conical cylindrical embodiments of the present invention that can be worn on the upper arm.
Figure 7B:
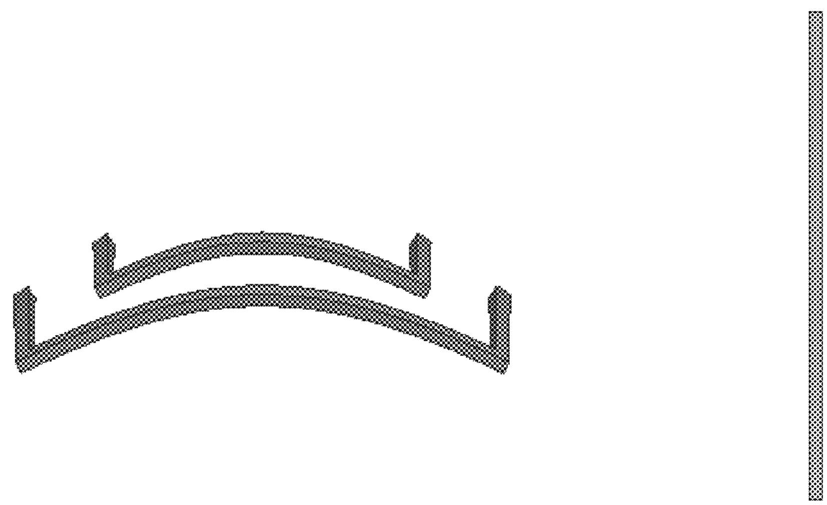
FIG. 7B illustrates two cylindrical embodiments of the present invention that can be worn on the lower leg.

FIGS. 6A and 6B illustrate embodiments of the present invention that have conical symmetry. The wireless transmitter system of FIGS. 6A and B can have an inner loop and an outer loop that form a transmitter TX, and an inner loop and outer loop that form a receiver RX. The outer loops can act as resonators for the transmitter and receiver. The inner loop and outer loop of the transmitter can have conical symmetry, the inner loop and outer loop of the receiver can have conical symmetry, or both transmitter and receiver loops can have conical symmetry. If only one of the transmitter or receiver has conical symmetry, the other can be planar. In the embodiment shown in FIG. 6A, the arc of the outer loop can range from, for example, 270 to 355 degrees and, preferably, from 330 to 345 degrees, while the arc of the inner loop can span from, for example, 50 to 90 percent of the arc of the outer loop and, preferably, from 70 to 85 percent of the arc of the outer loop. In the embodiment shown in FIG. 6B, the arc of the outer loop can range from, for example, 90 to 270 degrees and, preferably, from 150 to 210 degrees, while the arc of the inner loop can span from, for example, 50 to 90 percent of the arc of the outer loop and, preferably, from 70 to 85 percent of the arc of the outer loop.

In some embodiments, particularly those that are designed to be wearable, the transmitters or receivers can be printed on thin flexible substrates. The transmitters or receivers can be attached on the body with epidermal adhesives. Alternatively, the transmitters or receivers can be weaved into textiles, integrated with clothes, or integrated with equipment (e.g. helmets, medical equipment, watches, sensors, glasses, sporting equipment, etc.). The conductive loops can be formed using conductive wire, conductive banding (thin conductive strips), or they can be formed using a printing process.

Figure 8A:
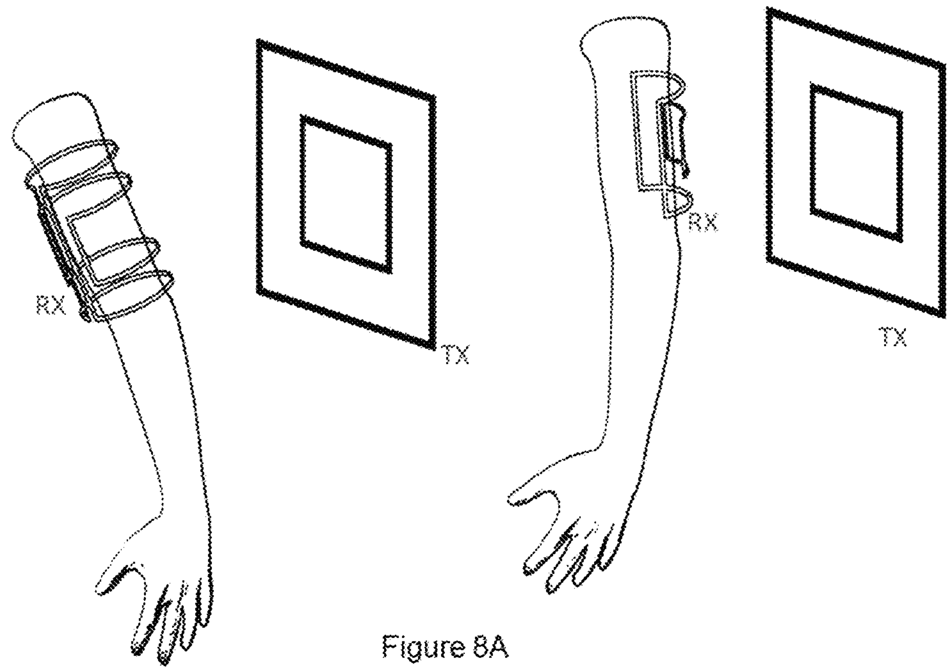
FIG. 8A illustrates two conical cylindrical embodiments of the present invention that can be worn on the upper arm.
Figure 8B:
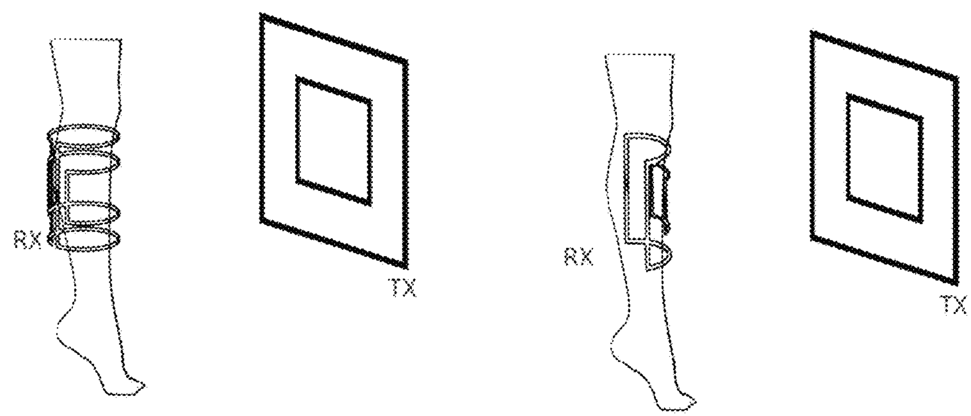
FIG. 8B illustrates two cylindrical embodiments of the present invention that can be worn on the lower leg.

FIGS. 8A and 8B illustrate embodiments of the invention that include a wearable cylindrical receiver RX to be worn on the upper arm and lower leg, respectively. The wearable cylindrical receivers can be coupled to a planar transmitter, as shown, or another type of transmitter (e.g., one with conical, cylindrical, or spherical symmetry can be used).

Figures 9, 10:
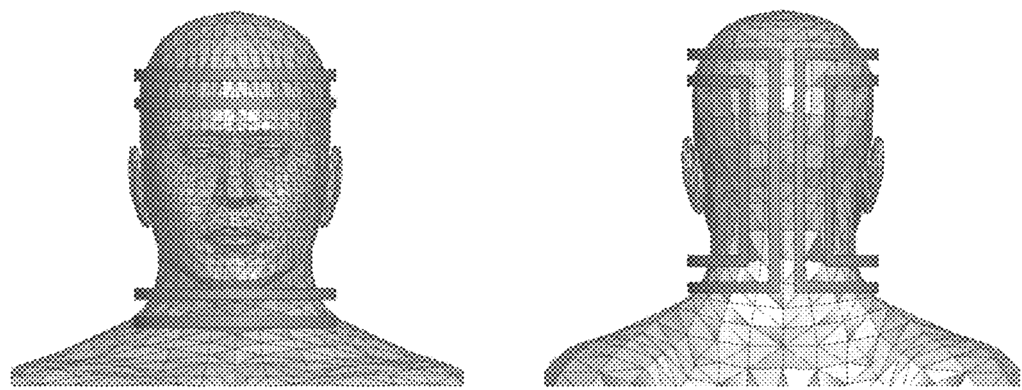
FIG. 9 illustrates a cylindrical embodiment of the present invention that can be worn on the head.
FIG. 10 illustrates a cylindrical embodiment of the present invention that can be worn as a necklace/neckband.
Figure 11:
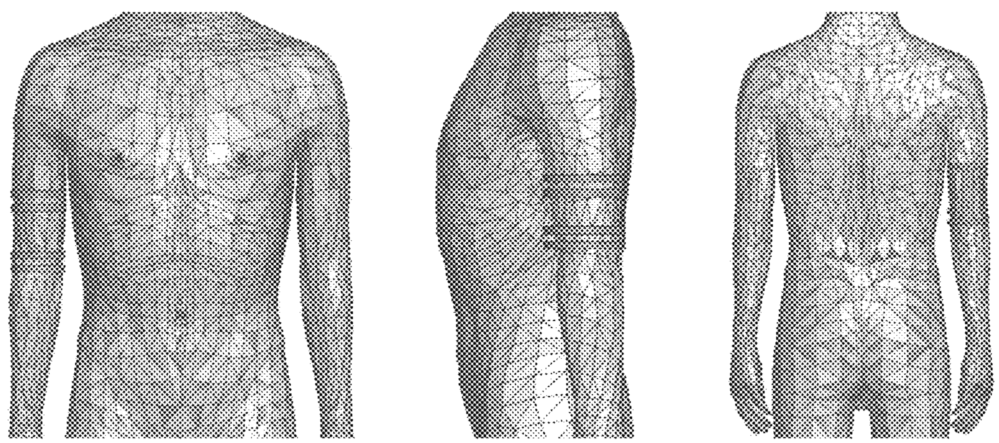
FIG. 11 illustrates a cylindrical embodiment of the present invention that can be worn as an upper arm cuff.
Figure 12:
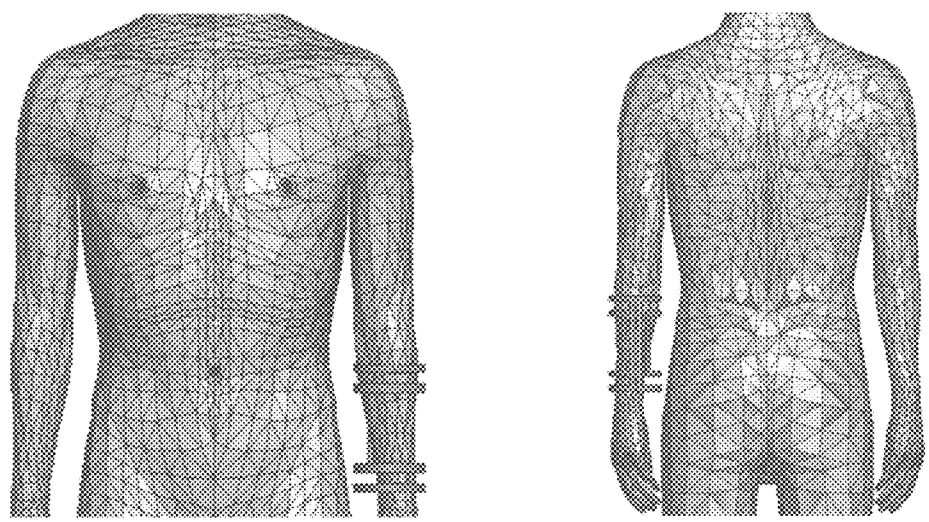
FIG. 12 illustrates a cylindrical embodiment of the present invention that can be worn as a lower arm cuff.
Figure 13:
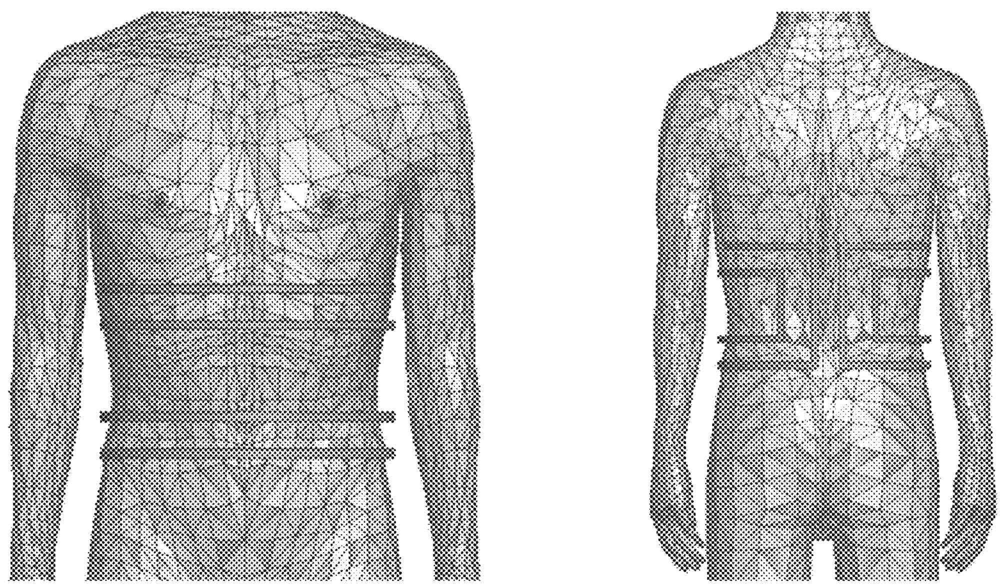
FIG. 13 illustrates a cylindrical embodiment of the present invention that can be worn as a waistband.
Figure 14:
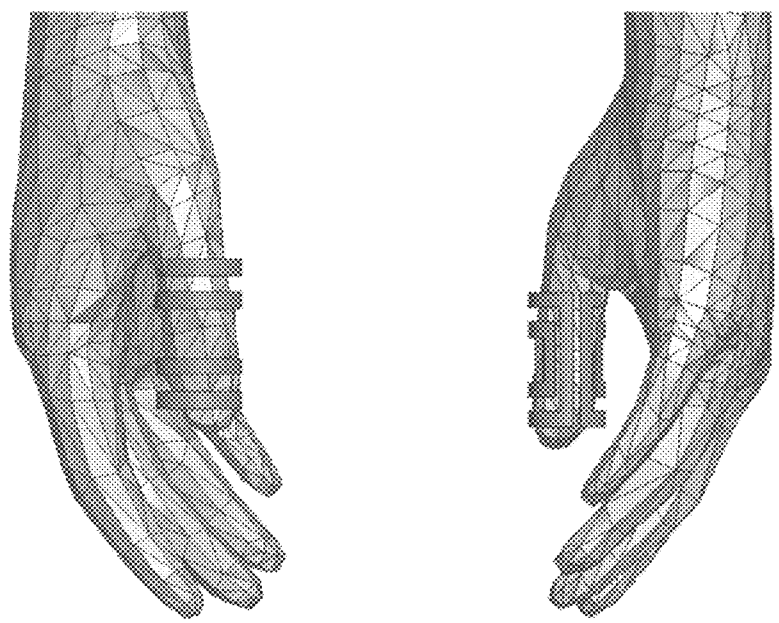
FIG. 14 illustrates a cylindrical embodiment of the present invention that can be worn as a ring or finger-cuff.
Figure 15:
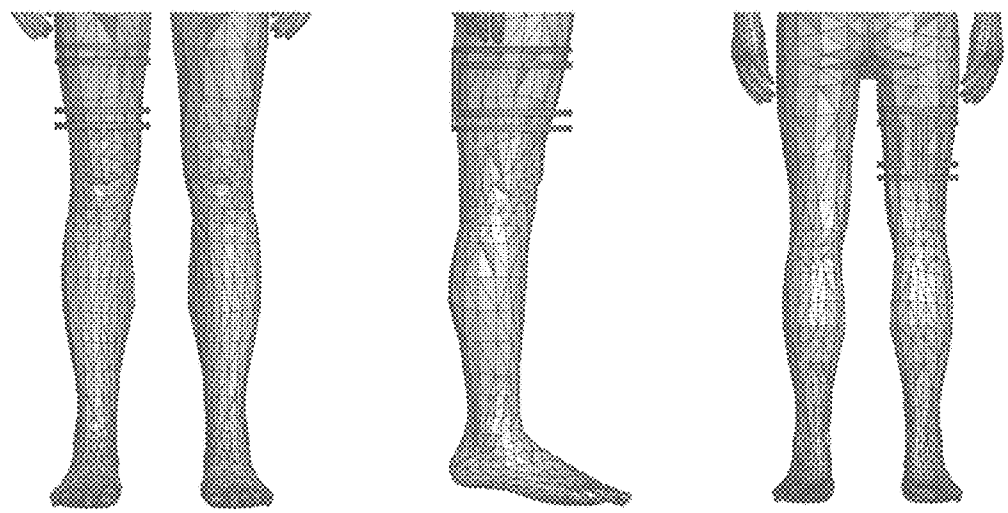
FIG. 15 illustrates a cylindrical embodiment of the present invention that can be worn on the thigh.
Figure 16:
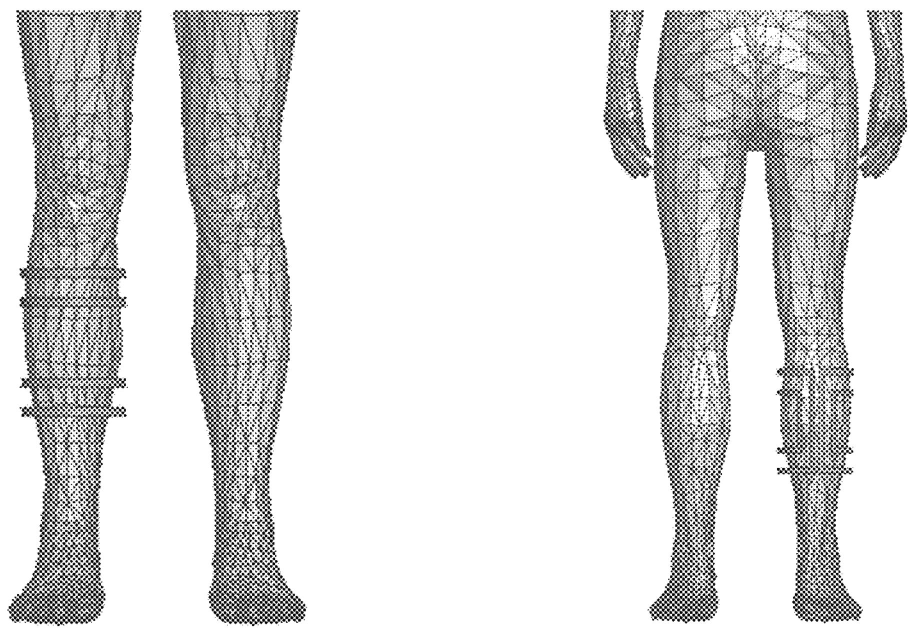
FIG. 16 illustrates a cylindrical embodiment of the present invention that can be worn on the calf.
Figure 17:
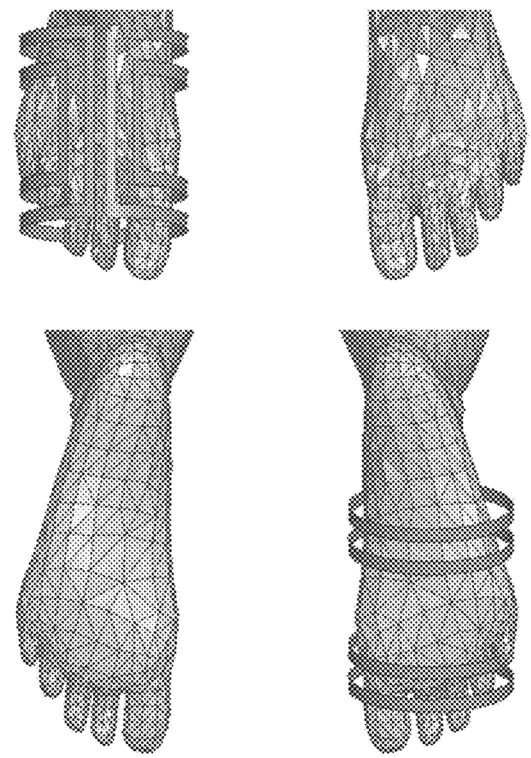
FIG. 17 illustrates a cylindrical embodiment of the present invention that can be worn on the foot.
Figure 18:
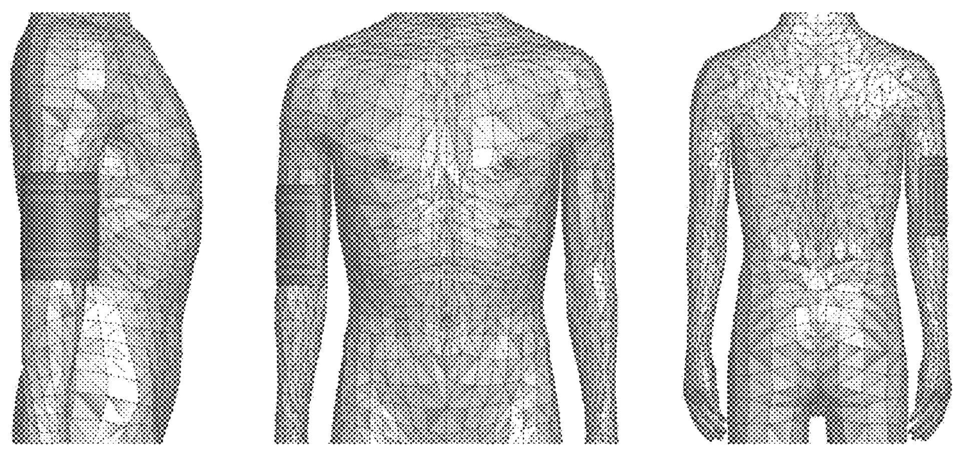
FIG. 18 illustrates a cylindrical embodiment of the present invention that can be worn on the upper arm.
Figure 19:
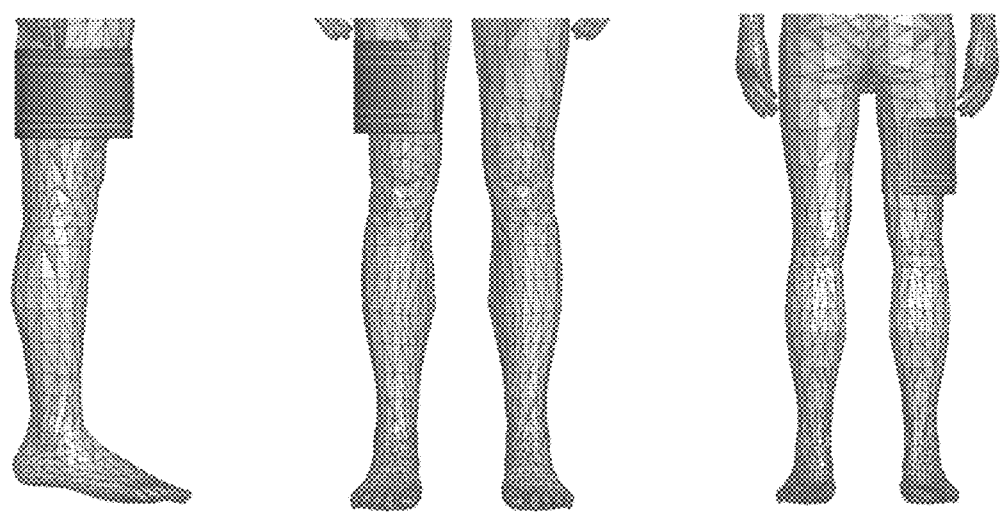
FIG. 19 illustrates a cylindrical embodiment of the present invention that can be worn on the thigh.

FIGS. 9-19 show examples of embodiments of the subject invention being worn on various body parts of a human subject. FIG. 9 illustrates a cylindrical embodiment of the present invention that can be worn on the head, e.g., in a helmet. FIG. 10 illustrates a cylindrical embodiment of the present invention that is can worn as a necklace or neckband. FIG. 11 illustrates a cylindrical embodiment of the present invention that is can worn as an upper arm cuff. It is envisioned that one application of an upper arm cuff embodiment would be for use with patients (e.g. hospital patients) to power sensors or devices that are integrated into the sleeve or attached to the sleeve. FIG. 12 illustrates a cylindrical embodiment of the present invention that can be worn as a lower arm cuff. FIG. 13 illustrates a cylindrical embodiment of the present invention that can be worn as a waistband. FIG. 14 illustrates a cylindrical embodiment of the present invention that can be worn as a ring or finger-cuff. FIG. 15 illustrates a cylindrical embodiment of the present invention that can be worn on the thigh. FIG. 16 illustrates a cylindrical embodiment of the present invention that can be worn on the calf. FIG. 17 illustrates a cylindrical embodiment of the present invention that can be worn on the foot or within a shoe. FIG. 18 illustrates a cylindrical embodiment of the present invention that can be worn on the upper arm. FIG. 19 illustrates a cylindrical embodiment of the present invention that can be worn on the thigh.

The subject invention includes, but is not limited to, the following exemplary embodiments.

Embodiment 1. A wireless power transfer system, comprising a receiver with a first loop that has cylindrical, conical, or spherical symmetry.

Embodiment 2. The wireless power transfer system according to embodiment 1, wherein the receiver further comprises a second loop, which surrounds the first loop, and also has the same type of symmetry as the first loop (i.e., cylindrical, conical, or spherical).

Embodiment 3. The wireless power transfer system according to any of embodiments 1-2, further comprising a transmitter with a third loop that has cylindrical, conical, or spherical symmetry, or is planar.

Embodiment 4. The wireless power transfer system according to embodiment 3, wherein the transmitter further comprises a fourth loop, which surrounds the third loop, and also has the same type of symmetry as the third loop (i.e., cylindrical, conical, or spherical, or is planar).

Embodiment 5. A wireless power transfer system comprising a transmitter with a first loop that has cylindrical, conical, or spherical symmetry.

Embodiment 6. The wireless power transfer system according to embodiment 5, wherein the transmitter further comprises a second loop, which surrounds the first loop, and also has the same type of symmetry as the first loop (i.e., cylindrical, conical, or spherical).

Embodiment 7. The wireless power transfer system according to any of embodiments 5-6, further comprising a receiver with a third loop that has cylindrical, conical, or spherical symmetry, or is planar.

Embodiment 8. The wireless power transfer system according to embodiment 7, wherein the receiver further comprises a fourth loop, which surrounds the third loop, and also has the same type of symmetry as the third loop (i.e. cylindrical, conical, or spherical, or is planar).

Embodiment 9. The wireless power transfer systems according to any of embodiments 1-8, wherein the transmitter, receiver, or both is/are a wearable device (e.g., wearable by a subject, such as a human subject), integrated with a wearable device, or attached to a wearable device.

Embodiment 10. The wireless power transfer systems according to any of embodiments 1-9, wherein the transmitter, receiver, or both is/are formed using conductive wiring, conductive tape, a printing process, and/or a flexible substrate.

Embodiment 11. The wireless power transfer system according to embodiment 9, wherein the wearable device is (configured to be) worn around the head, neck, upper leg, lower leg, upper arm, forearm, torso, finger, hand, waist, wrist, foot and/or ankle of a subject (e.g., a human subject).

Embodiment 12. The wireless power transfer systems according to any of embodiments 1-11, wherein the receiver (if present) is an implantable device (i.e., implantable into a subject, such as a human patient) (e.g., such as a pacemaker).

A greater understanding of the present invention and of its many advantages may be had from the following examples, given by way of illustration. The following examples are illustrative of some of the methods, applications, embodiments and variants of the present invention. They are, of course, not to be considered as limiting the invention. Numerous changes and modifications can be made with respect to the invention.

EXAMPLE 1

Figure 20A:
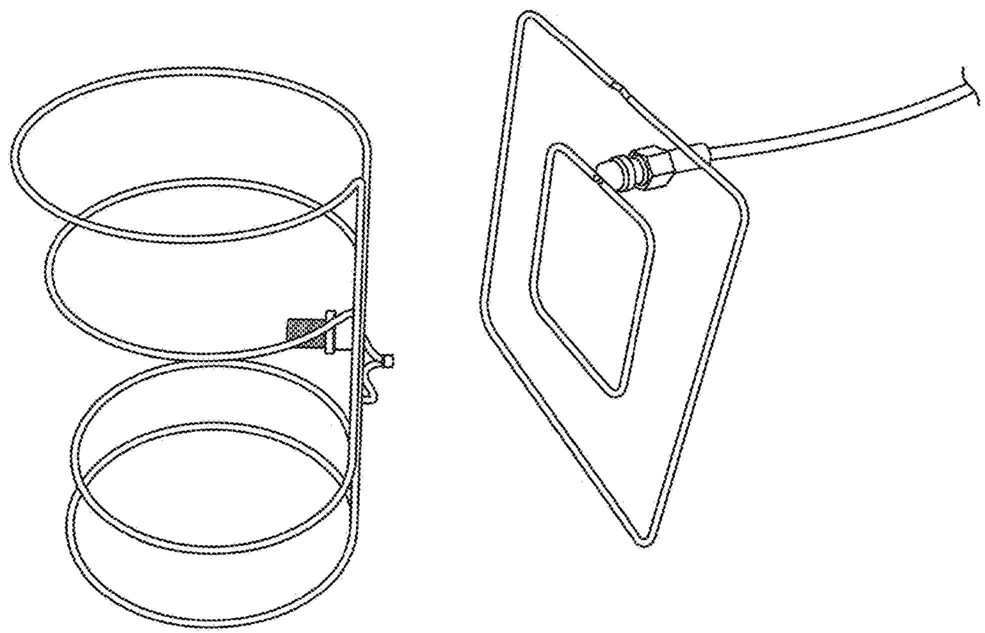
FIG. 20A is an image of a working example of a cylindrical embodiment of the present invention.
Figure 20:
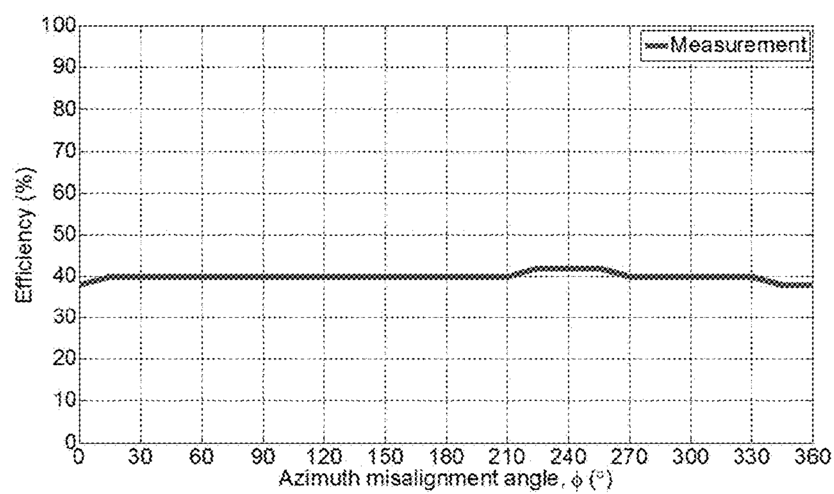
FIG. 20B is a graph of the measured efficiency of the working example of FIG. 20A.

A cylindrical WPT system according to an embodiment of the present invention was fabricated. FIG. 20A shows an image of this working example. In this example, the receiver had cylindrical symmetry. The diameter of the receiver cylinder was 60 millimeters (mm), and the total height (from the bottom of the outer loop to the top of the outer loop) of cylinder was 90 mm. The height of the inner cylinder (from the bottom of the inner loop to the top of the inner loop) was 45 mm. A 10 picoFarad (pf) capacitor was coupled to the outer loop of the receiver. The transmitter element was formed of two planar square loops. The length of each side of the outer square was 90 mm, and the length of each side of the inner square was 45 mm. A 12 pf capacitor was coupled to the outer loop of the transmitter. Both the transmitter and receiver were made of 1.7-mm thick copper wire. This example had the same geometries as the embodiment of FIGS. 4B to 4F; however, a high-Q capacitor was applied in this example for improved performance.

The efficiency of this system was measured at varying azimuthal misalignment angles, from 0 degrees to 360 degrees. FIG. 20B is a graph of this measured efficiency. Referring to FIG. 20B, the system was essentially insensitive to misalignment, as demonstrated by the nearly flat line for the measured efficiency.

EXAMPLE 2

Figure 21A:
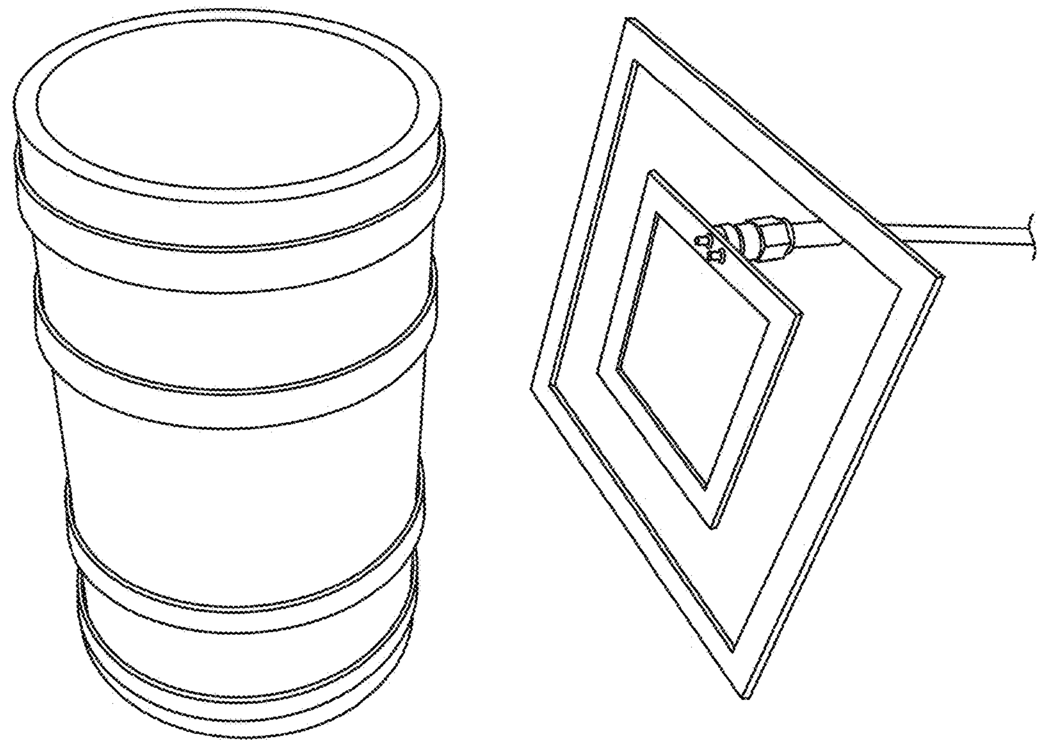
FIG. 21A is an image of a working example of a conformal cylindrical embodiment of the present invention.

A conformal cylindrical WPT system according to an embodiment of the present invention was fabricated. FIG. 21A shows an image of this working example. In this example, the receiver had cylindrical symmetry. The diameter of the receiver cylinder was 60 mm, and the total height (from the bottom of the outer loop to the top of the outer loop) of cylinder was 90 mm. The height of the inner cylinder (from the bottom of the inner loop to the top of the inner loop) was 45 mm. A 10 pf capacitor was coupled to the outer loop of the receiver. The transmitter element was formed of two planar square loops. The length of each side of the outer square was 90 mm, and the length of each side of the inner square was 45 mm. A 12 pf capacitor was coupled to the outer loop of the transmitter. Both the transmitter and receiver were made of copper banding that was 6 mm wide and 0.035 mm thick. The operating frequency of the design was 94.9 megaHertz (MHz).

Figure 21B:
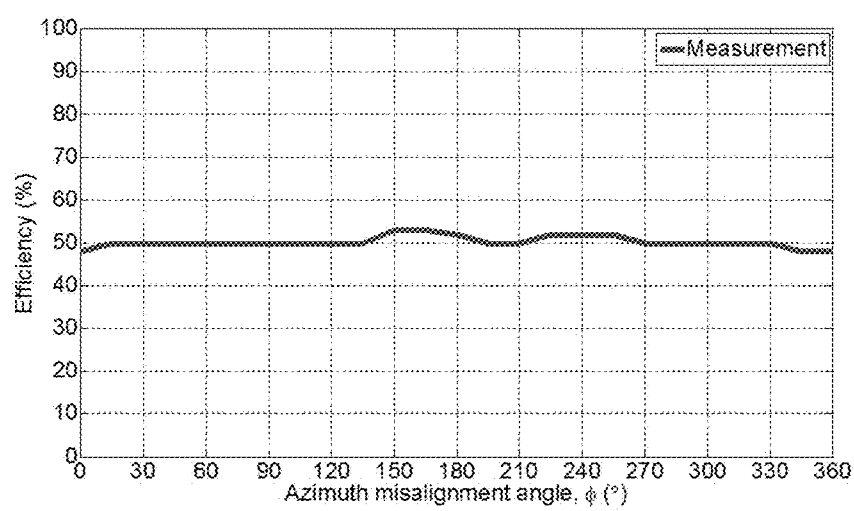
FIG. 21B is a first graph of the measured efficiency of the working example of FIG. 21A.

The efficiency of this system was measured at varying azimuthal misalignment angles, from 0 degrees to 360 degrees. FIG. 21B is a graph of this measured efficiency using a first set of collected data. Referring to FIG. 21B, the system was essentially insensitive to misalignment, as demonstrated by the nearly flat line for the measured efficiency.

Figure 21C:
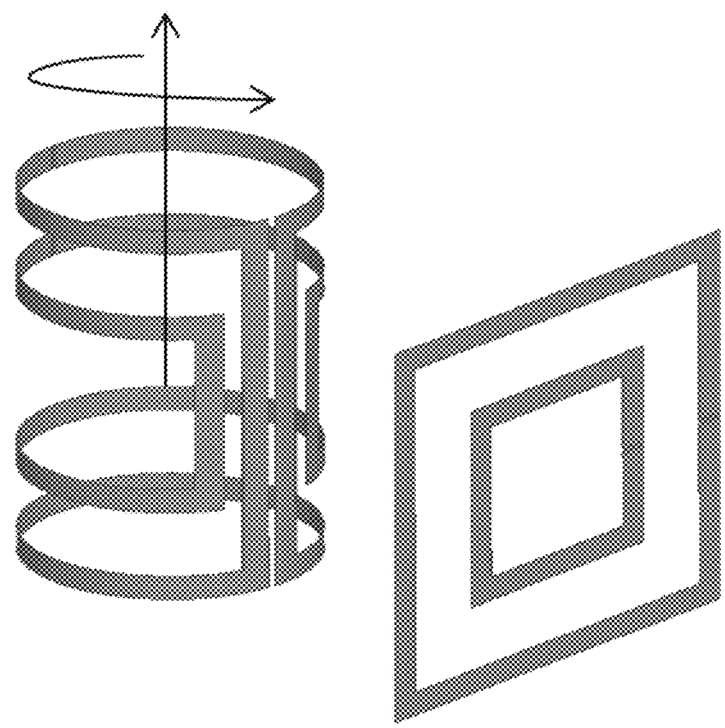
FIG. 21C is an illustration of a conformal cylindrical embodiment demonstrating cylindrical axis rotation for misalignment efficiency measurement.
Figure 21D:
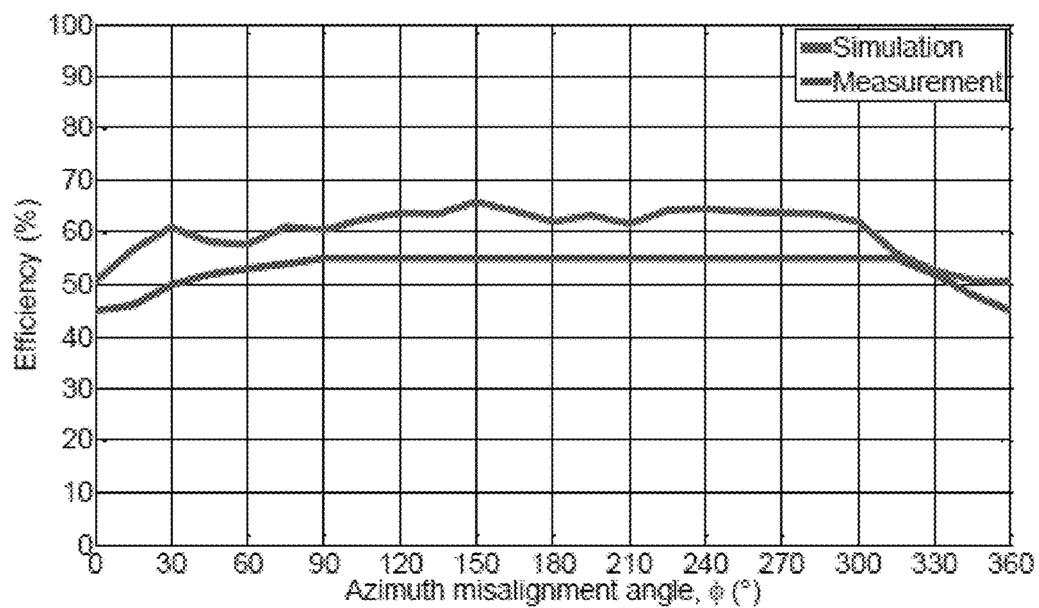
FIG. 21D is graph of the simulated efficiency and the measured efficiency of the working example of FIG. 21A using a second set of measured data.

FIG. 21C is an illustration of a conformal cylindrical embodiment (similar to that of the working example shown in FIG. 21A) demonstrating cylindrical axis rotation for misalignment efficiency measurement. FIG. 21D is graph of the simulated efficiency of the working example of FIG. 21A and a second set of measurement data showing the measured efficiency of the working example of FIG. 21A.

Figure 22A:
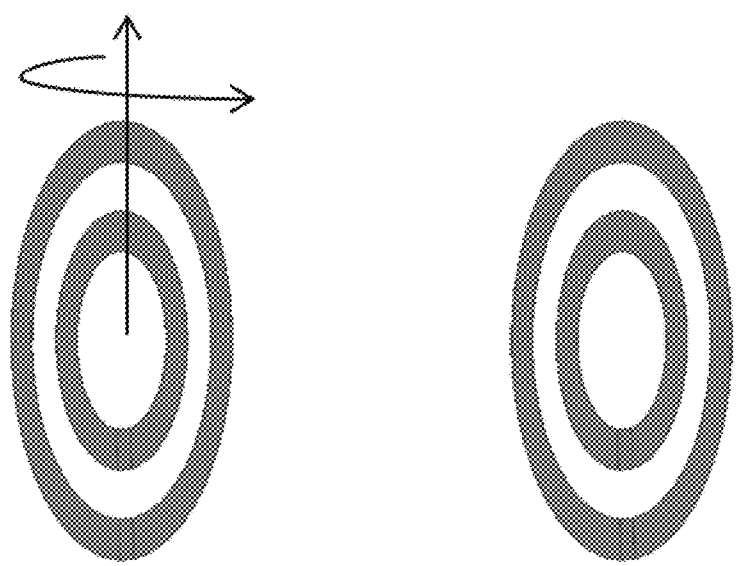
FIG. 22A is an illustration of concentric circular SCMR transmitters and receivers demonstrating the axis rotation for misalignment efficiency measurement.
Figure 22B:
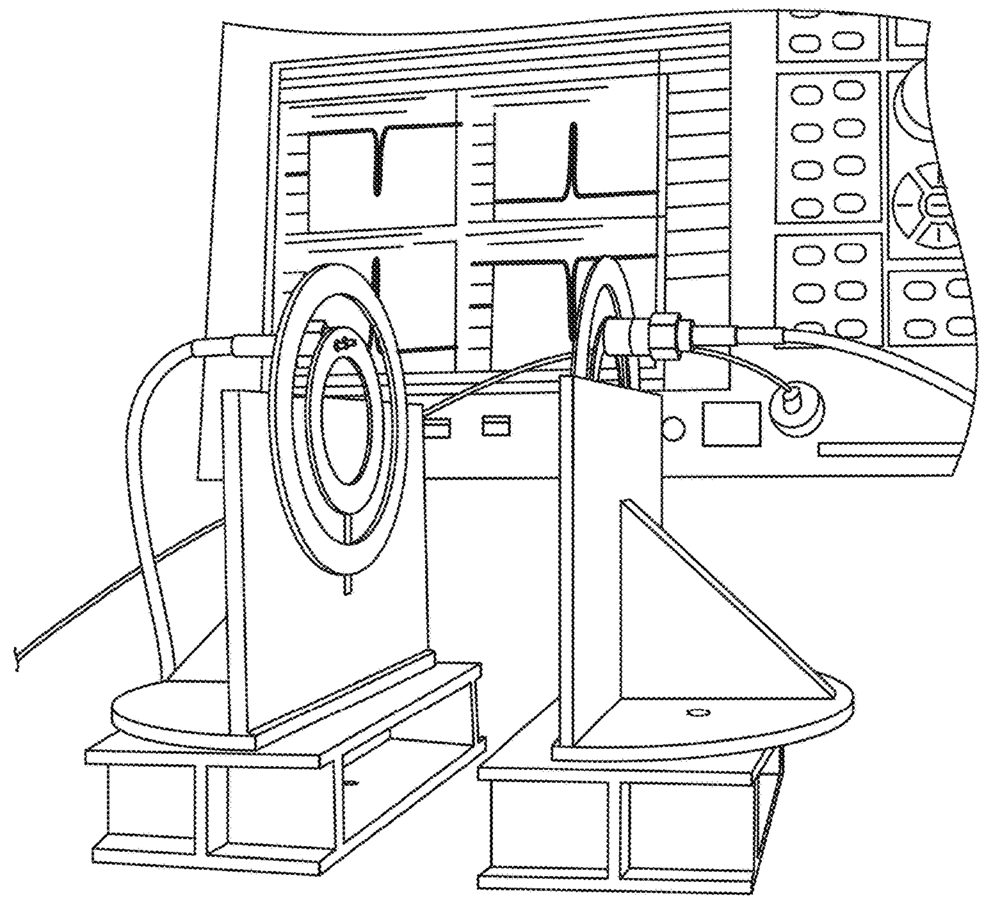
FIG. 22B is a working example of concentric circular SCMR transmitters and receivers.
Figure 22C:
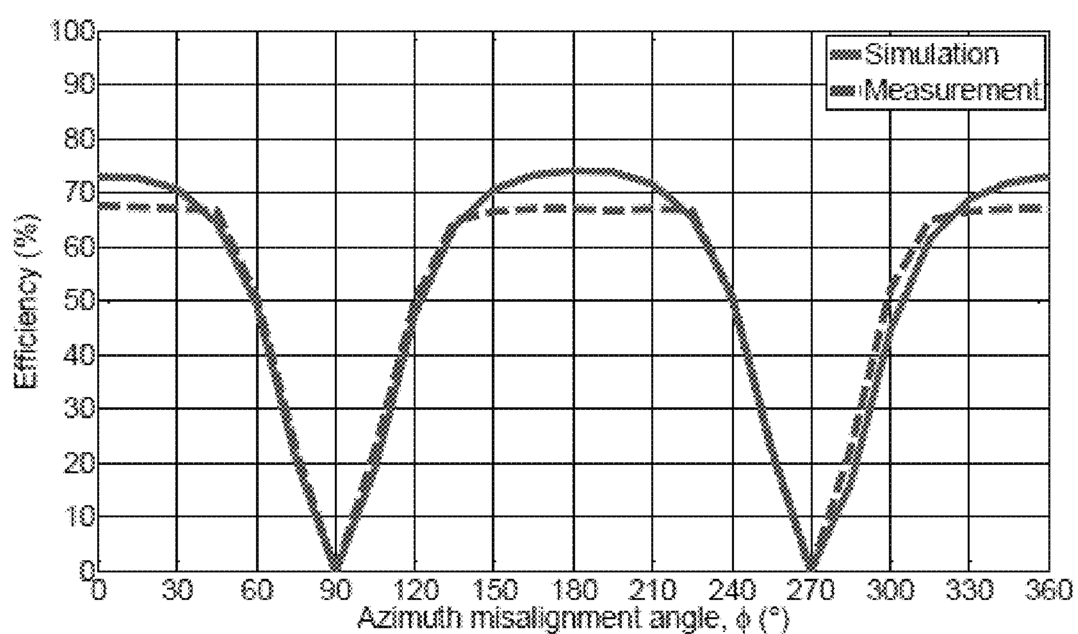
FIG. 22C is a graph showing simulated and measured efficiency as a function of misalignment angle for the working example of FIG. 22B.

FIG. 22A is an illustration of concentric circular SCMR transmitters and receivers demonstrating the axis rotation for misalignment efficiency measurement. FIG. 22B is a working example of concentric circular SCMR transmitters and receivers. The geometry specifications of the working example of FIG. 22B were as follows: the radii of both inner and outer circular strips were 15 mm and 30 mm respectively; the width and thickness of the copper strips were 6 mm and 0.035 mm respectively; the distance between the transmitter and receiver was 60 mm. The capacitors used on the TX and RX resonators were 33 pF each. The operating frequency of this design was 85.5 MHz. The efficiency of this design versus angular azimuth misalignment was calculated using ANSYS HFSS. FIG. 22C is a graph showing simulated and measured efficiency as a function of misalignment angle for the working example of FIG. 22B.

EXAMPLE 3

Figure 23:
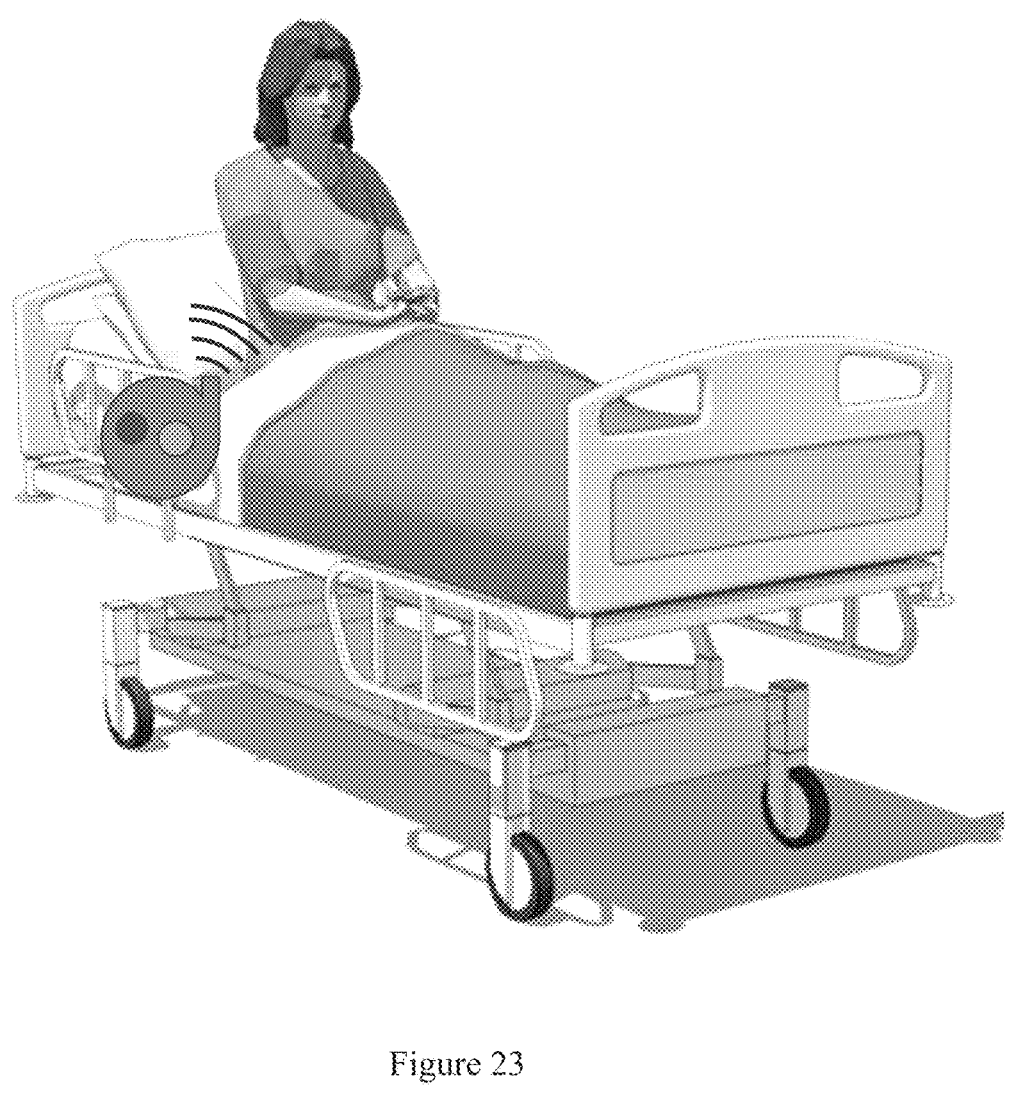

FIG. 23 is an image displaying an embodiment of the present invention that includes a wearable sleeve incorporating wireless power transfer elements, which is to be worn by patients. The wireless power transfer elements may be printed or retrofitted into the sleeve and may have conical, cylindrical, or spherical symmetry. The sleeve is designed to power sensors or devices that are necessary for patient care. The sensors or devices may be included in the sleeve or attached to the sleeve. The power transmitter may be attached to a patients bed, gurney, wheelchair, or a nearby location.

It should be understood that the examples and embodiments described herein are for illustrative purposes only and that various modifications or changes in light thereof will be suggested to persons skilled in the art and are to be included within the spirit and purview of this application.

All patents, patent applications, provisional applications, and publications referred to or cited herein are incorporated by reference in their entirety, including all figures and tables, to the extent they are not inconsistent with the explicit teachings of this specification.

What is claimed is:

1. A wireless power transfer system, comprising:
- a wireless transmitter comprising a planar source and a planar resonator; and
- a wireless receiver coupled with the wireless transmitter, the wireless receiver comprising:
  - a substrate;
  - a first conductive loop that has cylindrical, conical, or spherical symmetry; and
  - a second conductive loop formed around the first conductive loop and also having a same type of symmetry as the first conductive loop,
- the first conductive loop being a load, and the second conductive loop being a resonator,
- the second conductive loop comprising a capacitor, and
- each of the first conductive loop and the second conductive loop being conformally projected on the substrate.

2. The wireless power transfer system according to claim 1, the substrate having cylindrical, conical, or spherical symmetry.

3. The wireless power transfer system according to claim 2, each of the first conductive loop and the second conductive loop being conformally projected on the substrate such that the first and second conductive loops conform to the geometry of the substrate.

4. The wireless power transfer system according to claim 1, the first conductive loop having cylindrical symmetry.

5. The wireless power transfer system according to claim 1, the first conductive loop having conical symmetry.

6. The wireless power transfer system according to claim 1, the first conductive loop having spherical symmetry.

7. The wireless power transfer system according to claim 1, the wireless power transfer system being a wearable device.

8. A wireless power transfer system, comprising:
- a wireless transmitter comprising a planar source and a planar resonator; and
- a wireless power receiver coupled with the wireless transmitter,
- the wireless receiver comprising:
  - a substrate;
  - a first conductive loop that has cylindrical symmetry; and
  - a second conductive loop, which also has cylindrical symmetry, around the first conductive loop,
- the first conductive loop being a load and the second conductive loop being a resonator,
- the second conductive loop comprising a capacitor, and
- each of the first conductive loop and the second conductive loop being conformally projected on the substrate.

9. The wireless power transfer system according to claim 8, the substrate having cylindrical symmetry.

10. The wireless power transfer system according to claim 9, each of the first conductive loop and the second conductive loop being conformally projected on the substrate such that the first and second conductive loops conform to the geometry of the substrate.

11. The wireless power transfer system according to claim 8, the wireless power receiver being a wearable device.

12. The wireless power transfer system according to claim 8, an arc of the resonator spanning from 90 degrees to 360 degrees of the cylinder.

13. The wireless power transfer system according to claim 12, an arc of the load spanning from 80 percent to 90 percent of the resonator arc.

14. The wireless power transfer system according to claim 8, an arc of the resonator spanning from 330 degrees to 355 degrees.

15. The wireless power transfer system according to claim 14, an arc of the load spanning from 80 percent to 90 percent of the resonator arc.

16. A wireless power transfer system, comprising:
- a wireless transmitter comprising a planar source and a planar resonator; and
- a wireless power receiver coupled with the wireless transmitter,
- the wireless receiver comprising:
  - a substrate;
  - a first conductive loop that has conical symmetry; and
  - a second conductive loop, which also has conical symmetry, around the first conductive loop,
- the first conductive loop being a load and the second conductive loop being a resonator,
- the second conductive loop comprising a capacitor, and
- each of the first conductive loop and the second conductive loop being conformally disposed on the substrate.

17. The wireless power transfer system according to claim 16, the substrate having conical symmetry, and
- each of the first conductive loop and the second conductive loop being conformally projected on the substrate such that the first and second conductive loops conform to the geometry of the substrate.

18. The wireless power transfer system according to claim 16, an arc of the resonator spanning from 90 degrees to 360 degrees of the cone, and
- an arc of the load spanning from 80 percent to 90 percent of the resonator arc.

19. The wireless power transfer system according to claim 16, an arc of the resonator spanning from 330 degrees to 355 degrees of the cone, and
- an arc of the load spanning from 80 percent to 90 percent of the resonator arc.

20. The wireless power transfer system according to claim 19, the wireless power receiver being packaged as a wearable device.

* * * * *